United States Patent [19]
Amer et al.

[11] Patent Number: 5,682,042
[45] Date of Patent: Oct. 28, 1997

[54] NONBOLOMETRIC SUPERCONDUCTIVE PHOTORESPONSIVE

[75] Inventors: Nabil Mahmoud Amer, Armonk; Elia Zeldov, Ossining, both of N.Y.

[73] Assignee: International Business Machines Corporation, Armonk, N.Y.

[21] Appl. No.: 193,666

[22] Filed: Feb. 9, 1994

Related U.S. Application Data

[63] Continuation of Ser. No. 721,462, Jun. 28, 1991, abandoned.
[51] Int. Cl.$^6$ ............... H01L 29/06; H01L 31/0256; H01L 39/22
[52] U.S. Cl. ............... 257/31; 257/34; 257/33
[58] Field of Search ............... 357/5; 505/1, 847, 505/846, 193, 234, 237, 239; 257/30–35

[56] References Cited

U.S. PATENT DOCUMENTS 4,760,440  7/1988  Bigler et al. ............... 357/74

OTHER PUBLICATIONS

Youichi et al., "Optical Detector Using Superconducting Ba Pb Bi O Thin Films", J. Appl. Phys., vol. 59, #11, 1 Jun. 1986, pp. 3807–3814.
Forrester et al., "Optical Response of Epitaxial Films of YBaCuO", App. Phys. Lett., vol. 53, #14, 3 Oct. 1988, pp. 1332–1334.
"Epitaxy and Orientation of $Eu_1Ba_2Cu_3O_{7-y}$ Films Grown in Situ by Magnetron Sputtering", Hidefumi Asano et al., Jap. J. of Appl. Phys. vol. 28, #6, Jun. 1989, pp. L981–L983.
P.W. Anderson, Physical Review Letters, vol. 9, No. 7, pp. 309–311, (1 Oct. 1962).
V. Ambegaokar and B.I. Halperin, Physical Review Letters, vol. 22, No. 25, pp. 1364–1366, (23 Jun. 1969).
D.N. Langenberg in Proceedings of the Fourteenth International Conference on Low Temperature Physics—LT/4, M. Krusius and M. Vuorio, eds, vol. 5, (North Holland, Amsterdam, 1975), pp. 223–263. No Month.
M. Leung et al., Applied Physics Letters, vol. 51, pp. 2046–2407, (14 Dec. 1987).
B. Oh et al., Physical Review B, vol. 37, No. 13, pp. 7861–7864, (1 May 1988).
Y. Yeshurun and A.P. Malozemoff, Physical Review Letters, vol. 60, No. 21, pp. 2202–2205, (23 May 1988).
J.Y. Juang et al., Physical Review B, vol. 38, No. 10, pp. 7045–7048, (1 Oct. 1988).
M.G. Forrester et al., Applied Physics Letters, vol. 53, pp. 1332–1334, (3 Oct. 1988).
M. Tinkham, Physical Review Letters, vol. 61, No. 14, pp. 1658–1661, (3 Oct. 1988).
T.T.M. Palstra et al., Physical Review Letters, vol. 61, No. 14, pp. 1662–1665 (3 Oct. 1988).
J. Mannhart et al., Physical Review Letters, vol. 61, No. 21, pp. 2476–2479, (21 Nov. 1988).
Y. Yeshurun et al., Physical Review B, vol. 38, No. 16, pp. 11,828–11831, (1 Dec. 1988).
Y. Iye et al., Physica C, vol. 153–155, pp. 26–31, (1988). No Month.
Y. Enomoto et al., Physica C, vol. 153–155, pp. 1592–1597, (1988). No Month.
High Tc Update, vol. 3, No. 4, pp. 1,3,10, (15 Feb. 1989).
T.T.M. Palstra et al., Applied Physics Letters, vol. 54, pp. 763–765, (20 Feb. 1989).

(List continued on next page.)

Primary Examiner—Sara W. Crane
Assistant Examiner—Douglas Wille
Attorney, Agent, or Firm—Daniel P. Morris

[57] ABSTRACT

The optical response of high-quality epitaxial copper-oxide perovskite films on substrates such as $LaGaO_3$ and $SrTiO_3$ exhibits a nonbolometric component to a photoresponse at certain temperatures below the onset of the superconducting transition and when carrying bias currents of a certain magnitude. A nonbolometric superconductive photoresponsive cell and method employ such films. The photoresponsive cell and method of the invention can be used to detect electromagnetic radiation incident on the film and to switch or modulate electrical signals passing through the film.

21 Claims, 8 Drawing Sheets

OTHER PUBLICATIONS

G. Koren et al., *Applied Physics Letters*, vol. 54, pp. 1054–1056, (13 Mar. 1989).

*Bulletin of the American Physical Society*, vol. 34, No. 3, pp. 1038, abstracts Nos. S215, S216, S217 and S218, (Mar. 1989).

A. Frenkel et al., *Applied Physics Letters*, vol. 54, pp. 1594–1596, (17 Apr. 1989).

J.D. Hettinger et al., *Physical Review Letters*, vol. 62, No. 17, pp. 2044–2047, (24 Apr. 1989).

E. Zeldov et al., *Physical Review B*, vol. 39, No. 13, pp. 9712–9714, (1 May 1989).

W.R. Donaldson et al., *Applied Physics Letters*, vol. 54, pp. 2470–2472, (12 Jun. 1989).

H.S. Kwok et al., *Applied Physics Letters*, vol. 54, pp. 2473–2475, (12 Jun. 1989).

E. Zeldov et al., *Physical Review Letters*, vol. 62, No. 26, pp. 3093–3096, (26 Jun. 1989).

A. Frenkel et al., *Applied Physics Letters*, vol. 55, pp. 911–913, (28 Aug. 1989).

D.W. Cooke et al., *Applied Physics Letters*, vol. 55, pp. 914–916, (28 Aug. 1989).

U. Dai et al., *Applied Physics Letters*, vol. 55, pp. 1135–1136, (11 Sep. 1989).

J. Talvacchio et al., in *Science and Technology of Thin-Film Superconductors*, R. McConnell and S.A. Wolf (Plenum, 1989), pp. 449–458. No Month.

NONBOLOMETRIC SUPERCONDUCTIVE PHOTORESPONSIVE

This is a continuation of application Ser. No. 07/721,462, filed Jun. 28, 1991 now abandoned.

FIELD OF THE INVENTION

The present invention generally concerns a photoresponsive cell and more specifically concerns a photoresponsive cell which includes a superconductive material as a photoresponsive element.

BACKGROUND ART

With the discovery of high-temperature superconductors, the possible application of superconductive $YBa_2Cu_3O_{7-\delta}$ films for wide spectral range optical detection has been proposed. Two types of film have been reported to have been investigated for optical detection: film granular in structure or epitaxially grown film.

In the case of granular films, an optical response has been attributed to photoinduced phase slips across the weak links between the grains of the superconducting material. M. Leung et al. *Appl. Phys. Lett.* vol. 51, pg. 2046, (1987).

In the case of epitaxially-grown film, the optical response was reported to be a bolometric effect which modulated the sample resistivity due to the heating of the incident radiation. Y. Enomoto et al. *Physica* C vol. 153–155, pg. 1592–1597, (1988); M. G. Forrester et al. *Appl. Phys. Lett.* vol. 53, pg. 1332–1334 (1988). In the article by Forrester et al., it was indicated that the estimated detectivity of the optical detectors of the article—which were based on epitaxial yttrium barium copper oxide film—was greater than that reported for granular films of the same material, but represented an intrinsically slower mechanism. In the article by Enomoto et al., it was concluded that a single crystalline yttrium barium copper oxide film in an optical detector worked as a bolometer. It was indicated that the conclusion was based in part on the slow response of the film as compared to a polycrystalline film of a barium lead bismuth oxide superconductor.

SUMMARY OF THE INVENTION

We have discovered that certain copper-oxide perovskite materials can exhibit, in addition to a bolometric effect, a strong nonbolometric response to incident radiation.

The photoresponsive cell of the invention produces an electrical response when irradiated with electromagnetic radiation.

The photoresponsive cell of the invention comprises a housing which has an illumination port for admitting electromagnetic radiation into an interior of the housing.

The photoresponsive cell of the invention also includes a photoresponsive element mounted in the housing at a location such that electromagnetic radiation passing through the illumination port will illuminate at least a portion of the photoresponsive element.

The photoresponsive element includes a substantially-single-crystalline support substrate having an illumination-stage surface. The illumination-stage surface is positioned and oriented to be illuminated by electromagnetic radiation passing through the illumination port of the housing.

The photoresponsive element of the photoresponsive cell of the invention further includes a substantially-single-crystalline photoresponsive film of a copper-oxide perovskite material such as $YBa_2Cu_3O_{7-\delta}$ located on the illumination-stage surface of the support substrate in an epitaxially oriented relationship. The copper-oxide perovskite material has a superconductive transition at a superconductive-transition temperature. A normal threshold electrical resistivity of the copper-oxide perovskite material is denoted $\rho_n$ and defined by the normal electrical resistivity of the material at temperature just above the onset of the superconductive transition.

The photoresponsive element of the photoresponsive cell of the invention also includes bias-current electrodes electrically connected to the photoresponsive film at spaced-apart locations to define a bias-current flow path for a length of the film through which the bias current can flow. The photoresponsive film is dimensioned to have an effective cross-sectional area in a plane through which the bias current can flow.

The photoresponsive cell of the invention also includes a temperature controller for controlling the temperature of the photoresponsive film in operation at a temperature in a nonbolometric-photoresponse-component temperature range. The nonbolometric-photoresponse-component temperature range is such that the electrical resistivity of the photoresponsive film is greater than zero and less than or equal to a nonbolometric-photoresponse-component limit resistivity.

Finally, the photoresponsive cell of the invention includes bias-current supply connectors connected to the bias-current electrodes for supplying a nonbolometric-photoresponse-component bias current to the photoresistor film, the nonbolometric-photoresponse-component bias current having a value such that the current density relative to the effective cross-sectional area of the photoresponsive film is equal to or greater than a nonbolometric-photo-response component limit current density.

The copper-oxide perovskite material should be of a nonbolometric-photoresponse-component-grade high quality. In general, the higher the quality of the copper-oxide perovskite material—as evidenced for example, by the sharpness of the superconductive transition at low current densities and the magnitude of the critical current density—the greater the nonbolometric photoresponse component. Preferred epitaxial films of $YBa_2Cu_3O_{7-\delta}$ for the present invention have a superconductive transition width at low current densities of about 2 degrees or less and have a critical current density of about $10^6$ A/cm$^2$ or greater.

Preferably, the copper-oxide perovskite material is $YBa_2Cu_3O_{7-\delta}$. For an epitaxial film of $YBa_2Cu_3O_{7-\delta}$, the nonbolometric-photoresponse-component limit resistivity is preferably about 0.15 $\rho_n$ and the nonbolometric-photoresponse-component limit current density is about $7\times10^3$ A/cm$^2$.

The copper-oxide perovskite material $Bi_2Sr_2CaCu_2O_x$ appears to be suitable for the present invention.

Preferred photoresponsive cells of the present invention are expected to be useful as infrared radiation detectors.

Preferred photoresponsive cells of the invention can be used to advantage generally to couple optical signals into superconductive circuits. Preferred embodiments of the photoresponsive cell invention can function as optically-driven signal switches and modulators.

Two novel phenomena may be observed in yttrium barium copper oxide films at elevated currents and at low resistivities even in presence of magnetic fields which appear to be flux-creep related: (1) a sharp onset of nonbolometric optical response, and (2) a current-dependent thermally-activated electrical resistivity. For $YBa_2Cu_3O_{7-\delta}$ films in this regime, the activation energy of the resistivity scales uniquely with current density as $\log(J_0/J)$, with $J_0$ approximately equal to $3\times10^6$ A/cm$^2$. This nonlinear current dependence is significantly different from the predictions of a standard flux creep model. At current densities of less than about $7\times10^3$ A/cm$^2$, the resistivity appears to be current independent and the optical response is essentially purely bolometric.

We have also discovered that the dissipation in $YBa_2Cu_3O_{7-\delta}$ epitaxial films can be significantly enhanced by increased current densities as well as by optical excitation. In both cases the observed transition from quasi-thermal equilibrium behavior to the enhanced dissipation regime occurs under the same low resistivity and high current conditions. In the latter regime, the dissipation is thermally activated with a unique nonlinear dependence of the activation energy on current density, a result that is essentially different from the predictions of the simple flux creep model.

DETAILED DESCRIPTION OF THE PREFERRED EMBODIMENTS

Thin films of $YBa_2Cu_3O_{7-\delta}$ can be deposited by laser ablation on (100) $LaGaO_3$ and $SrTiO_3$ substrates as described below.

Photoresponsive cells of the invention can be prepared as follows. A film of $YBa_2Cu_3O_{7-\delta}$ can be deposited on a substrate of $LaGaO_3$ by a laser ablation process. The laser ablation can be carried out in a deposition chamber made of fused silica which is generally cylindrical in shape with a cylinder axis extending vertically, roughly 200 mm in diameter and roughly 400 mm high. The chamber can have five ports approximately 100 mm in diameter opening into it with a vacuum-tight flange attached to each. A first flange is located at the top of the deposition chamber for a resistively heated stainless-steel substrate holder. The substrate holder can be heated to about 900° C. A second flange is located at the bottom of the chamber for connecting a vacuum pump and pressure gauges. Three flanges are located in an essentially horizontal plane passing midway through the deposition chamber. Axes passing through the three flanges define angles respectively of about 0°, 90° and 135°. Within the 90° flange a rotable target holder is located which can hold a ceramic pellet of $YBa_2Cu_3O_{7-\delta}$ about 3 mm thick and about 25 mm in diameter. The other two flanges have fused silica windows about 100 mm in diameter, one for admitting an incoming laser beam at approximately 135° to the surface of the target, and the other to enable side viewing of the plume ablated from the target material and for viewing the substrates when rotated at about 90° to face this window.

Pyrometric determination of the temperatures of the substrate surface can readily be carried out at the end of each deposition run using an infrared pyrometer (Barnes Optitherm 12-2026), since the surfaces of the hot films are black. The infrared pyrometer temperature measurements can be confirmed by a direct measurement of the film surface temperature, performed with the aid of a small thermocouple attached to the surface of the film. An additional thermocouple can be imbedded in the body of the substrate holder.

The substrates can be approximately rectangular in shape, about 4 mm×8 mm. The substrates can be glued to the sample substrate holder with a silver paste for good thermal contact. A target pellet can be located on the rotable target holder, facing the substrate and substantially parallel to its surface at a distance of about 30 mm.

Pulses of a frequency-doubled neodynium-doped yttrium-aluminum-garnet laser having a laser wavelength of about 532 nm, a pulse energy of about 0.2 J, and a pulse duration of about 10 ns can be used for the ablation process. The yttrium barium copper oxide target can be an approximately 25-mm diameter sintered pellet of $YBa_2Cu_3O_{7-\delta}$ prepared from a mixture of $Y_2O_3$, $BaCO_3$ and $CuO$ in proportions to give the desired stoichiometry. The mixture can be heated in oxygen at about 925° C. for about 8 hours. The resulting material can then be reground, pressed into a pellet, and heated to about 900° in air for about 16 hours. The pellet may then be furnace cooled slowly to room temperature over eight hours.

The laser pulse repetition rate is variable over the range of from about 1.5 Hz or 4 Hz. The laser beam can be focused down to an area of about 3.5 mm by about 2.5 mm on the surface of the target—as measured by the burn spot—to produce fluences in the range of from about 1.5 J/cm$^2$ to about 2.0 J/cm$^2$. To obtain film thickness uniformity, the focusing lens can be continuously rastered over an area about 9 mm by about 9 mm of the target. The focusing lens can be mounted on a translation stage and programmed to move horizontally and vertically so as to translate the laser beam in a zig-zag pattern on the pellet. In this way a film thickness uniform to within about ±5 percent over an area of about 15 mm by about 15 mm can generally be obtained. The laser-produced plume for the yttrium barium copper oxide target in about 200 mTorr $O_2$ ambient was purplish in color and had a cross section of about 20 mm diameter on the substrates.

A vacuum base pressure of about $2\times10^{-5}$ Torr, together with a few $O_2$ flushing cycles prior to each deposition run, can be used. During deposition the substrate surface temperature can be kept at about $725°\pm5°$ C. and the $O_2$ pressure in the cell at about 200 mTorr. Occasional $O_2$ flushings can be employed to reduce the accumulation of particulates in the deposition chamber.

At the end of the deposition process, oxygen to about 1 atm can be added slowly to the chamber while the substrate temperature is simultaneously lowered slowly to about 400° C. The films can be left at this temperature for half an hour and then slowly cooled down to room temperature.

The above deposition method yields high quality, c-axis oriented, epitaxial films with sharp superconducting transitions ($T_c(R=0)$) of up to about 92K) and high critical currents. Films from about 0.25 µm to about 0.6 µm thick were patterned using an excimer laser-microscope system to form a microbridge from about 25 to about 35 µm wide and from about 100 µm to about 200 µm long. The samples were placed in a vari-temp optical cryostat and their transport properties were measured using a four probe technique. An approximately 2 mW HeNe laser beam with a wavelength of about 633 nm was used as the optical excitation source. The laser beam was focussed to about 60 µm diameter on the microbridge and was mechanically chopped at a typical frequency of a few hundred Hz. The resulting voltage drop at a constant current was monitored with a lock-in amplifier.

Figure 8:
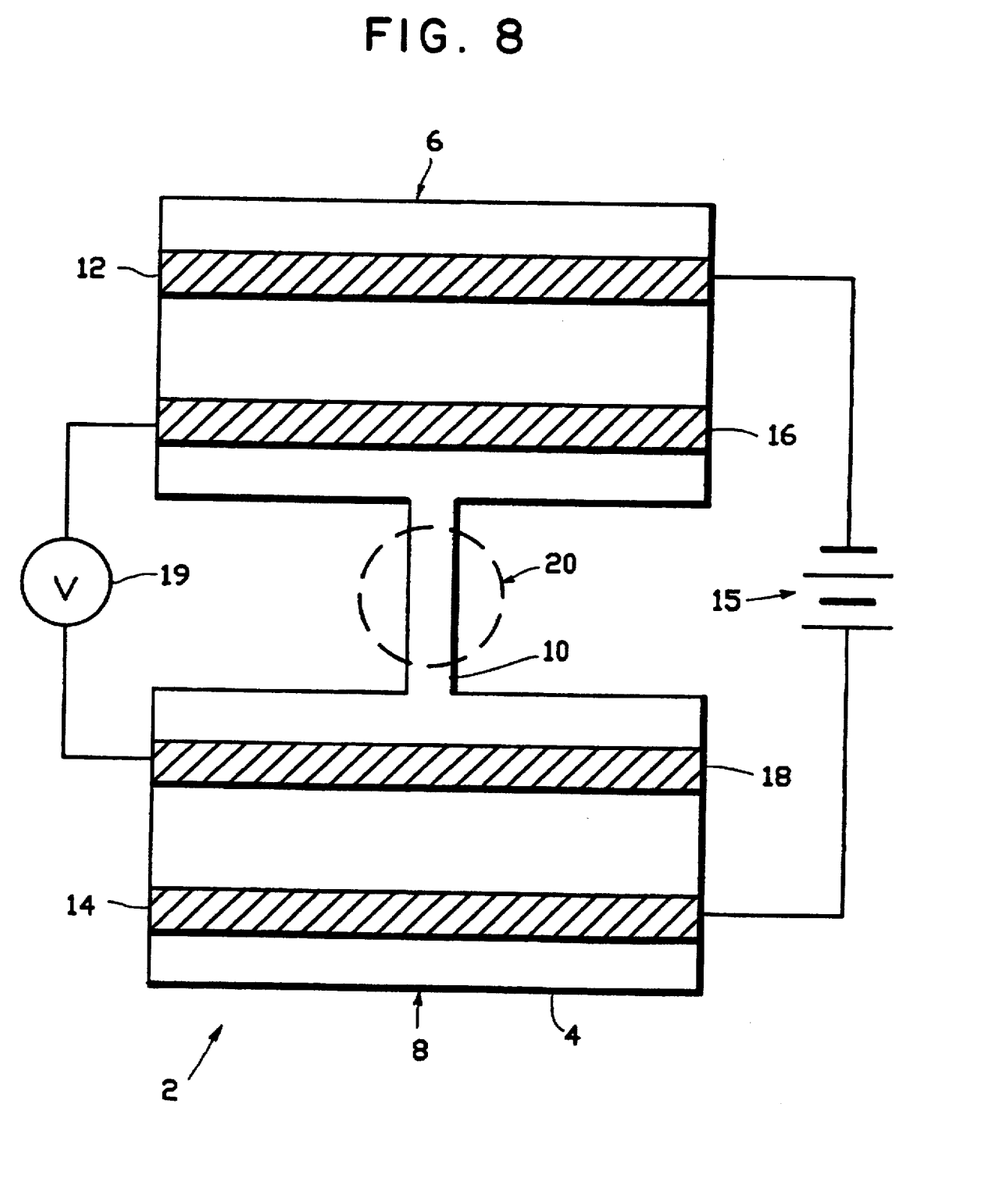
FIG. 8 is a schematic diagram of a preferred photoresponsive element of the present invention.

Turning now to FIG. 8, a photoresponsive cell of the invention includes a photoresponsive element 2 comprised of an epitaxial film 4 of $YBa_2Cu_3O_{7-\delta}$. The epitaxial film is shaped to define a first electrode-connection area 6 and a second electrode-connection area 8 which are connected by a microbridge 10. A first bias-current electrode 12 and a second bias-current electrode 14 are deposited on the first and the second electrode-connection areas 6 and 8 respectively. A bias-current supply 15 is electrically connected to the two bias-current electrodes 12 and 14 for passing a bias current through the microbridge 10. A first voltage sensing electrode 16 and a second voltage-sensing electrode 18 are deposited respectively on the first and the second electrode-connection areas 6 and 8. A voltage sensor 19 is connected to the first and the second voltage-sensing electrodes 16 and 18 to measure the voltage developed across the microbridge 10. A beam of light 20 can be focused on the microbridge 10 to generate an electrical photoresponse.

Figure 1:
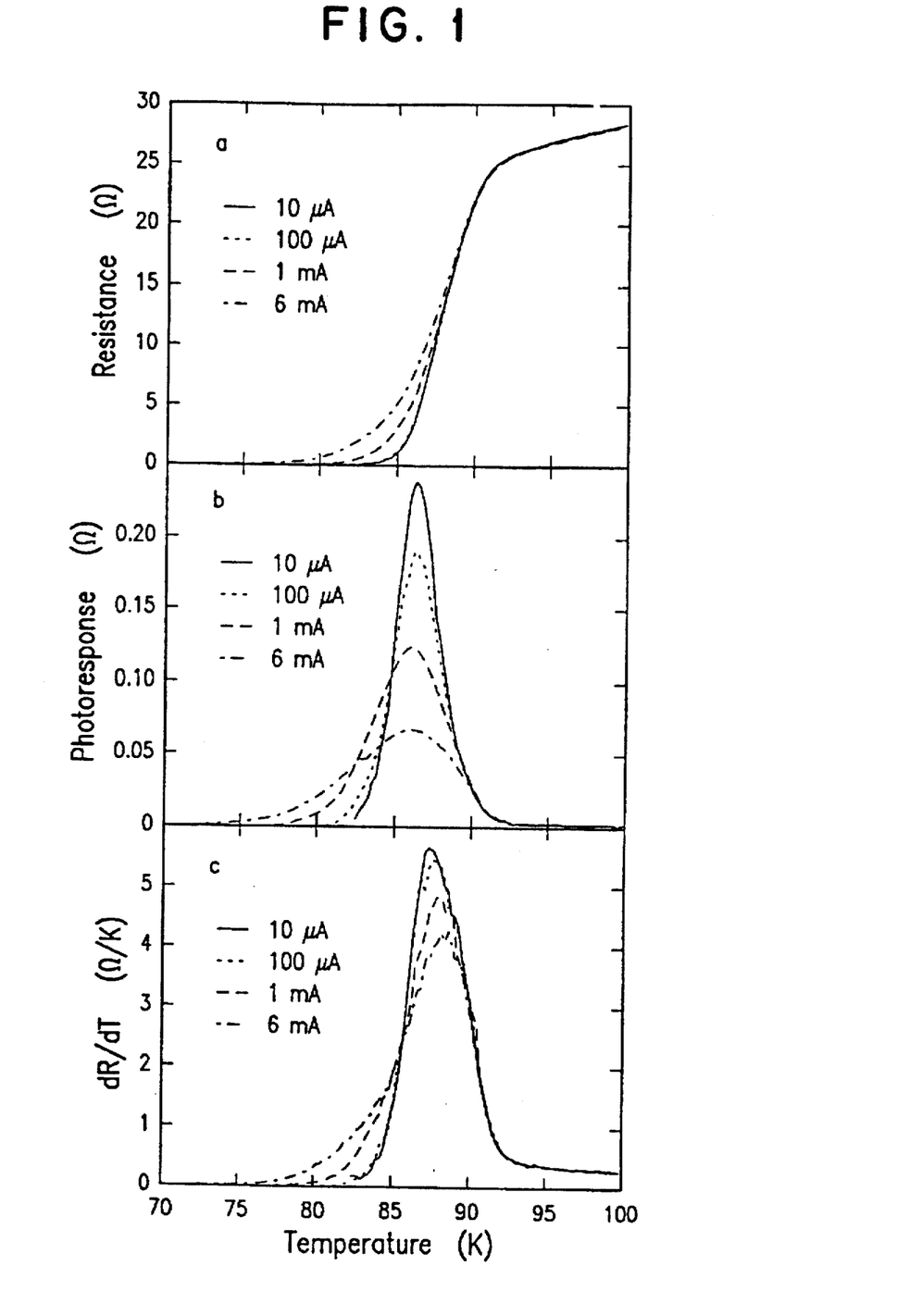
FIG. 1 shows graphs of (a) the temperature dependence of the resistance in ohms of an epitaxial $YBa_2Cu_3O_{7-\delta}$ film on a $LaGaO_3$ substrate at various bias currents, (b) the photoresponse of the film in ohms, and (c) the temperature derivative of the resistance in ohms per degree.

FIG. 1(a) shows the resistivity versus temperature characteristics of thin $YBa_2Cu_3O_{7-\delta}$ film on a $LaGaO_3$ substrate measured at four different currents. As the current is increased, the transition curve broadens towards lower temperatures as has previously been observed in high temperature superconductors. FIG. 1(b) shows the measured photoresponse as monitored by the lock-in amplifier and normalized by the bias current. The data in FIGS. 1(a) and 1(b) were acquired simultaneously as the dc and ac components of the voltage drop in the four probe configuration. The ac component was small compared to the dc voltage.

The photoresponse in FIG. 1(b) shows a sharp maximum in the superconductor transition region. If the photoresponse were purely bolometric, the induced voltage change, ΔV, due to a small temperature variation, ΔT, would be given by the formula:

$$\Delta V = I \frac{dR}{dT} \Delta T, \quad (1)$$

where I is the bias current and dR/dT is the temperature derivative of the resistance R(T). Since R(T) was measured directly as a function of the absolute temperature T as shown in FIG. 1(a), its temperature derivative could be calculated numerically. The resulting derivative of R(T) as a function of the absolute temperature T is shown in FIG. 1(c).

Significant differences between the photoresponse plotted in FIG. 1(b) and the derivative of the resistivity plotted in FIG. 1(c) may be readily observed. First, the maximum of the photoresponse curve occurs at lower temperatures than the maximum of the derivative curve. At 10 µA bias current, for example, the shift between the two maxima is about 1K whereas at 6 mA it is about 2.5K. Moreover, the maximum of the photoresponse curve shifts slightly to lower temperatures with increasing current, while the maximum of the derivative curve shifts to higher temperatures. In addition, the peak amplitude of the derivative in FIG. 1(c) varies only by about 25 percent when the bias current is changed from about 10 µA to about 6 mA, whereas the normalized photoresponse varies by a factor of more than approximately 3.5. The overall shape of the curves in FIGS. 1(b) and 1(c), and in particular, the broadening with the increased current, are significantly different. While the full-width-at-half-maximum of the derivative curve does not increase significantly with current, the photoresponse curve shows a peak which is considerably narrower than that of the derivative at a bias current of about 10 µA and which becomes much wider at higher bias.

The bolometric component of the photo signal can be determined at least approximately. The resistance characteristics in FIG. 1(a) show a finite slope above the onset of the superconductive transition, so the resistance changes with changes in temperature. In this region a bolometric signal will be present according to Equation (1) and there will be no superconductivity-related component. An examination of the photoresponse shows that the measured signal accurately follows the derivative of the resistivity above 90K at all the bias currents examined. Using Equation (1), a value of about 6.3 mK can be derived for an illuminated/dark temperature variation ΔT, which represents the rms variation of the film temperature due to the optical heating. Knowing ΔT and making use of Equation (1), the bolometric contribution to the measured photo signal can be estimated, assuming that the illuminated/dark temperature variation ΔT is temperature independent.

Figure 2:
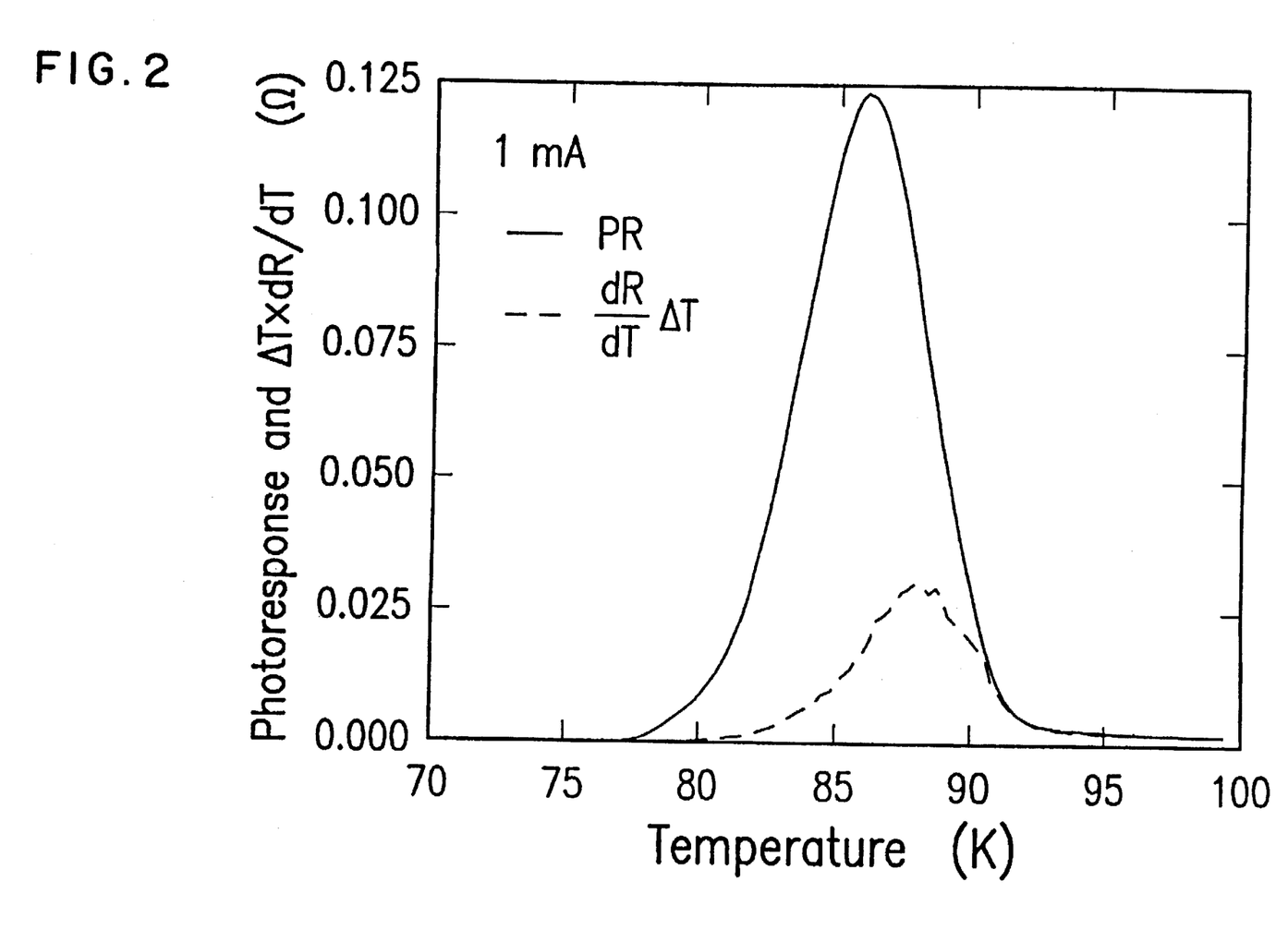
FIG. 2 is a graph of the photoresponse as a function of temperature and of the temperature derivative of the resistance multiplied by a temperature increment $\Delta T=6.3$ mK. The photoresponse accurately follows the product of the resistance derivative and $\Delta T$ at temperatures above about 90.5° K.

FIG. 2 shows the measured photoresponse and the calculated bolometric component at a bias current of approximately 1 mA. Above about 90K the measured signal appears to be purely bolometric, whereas at lower temperatures a nonbolometric response coexists with a bolometric signal. FIG. 2 shows that the nonbolometric component is substantially larger than the calculated bolometric contribution.

The following arguments demonstrate that the illuminated/dark temperature variation ΔT does not vary with temperature and is essentially constant as assumed above. At the low chopping frequencies used in the present study, illuminated/dark temperature variation ΔT is determined mainly by the thermal properties of the substrate. Measurements of the thermal diffusivity of the substrate material $LaGaO_3$ do not show, however, any significant variations in the relevant temperature range. Moreover, the illuminated/dark temperature variation ΔT above 90K remains constant. In order to explain the observed experimental results on a bolometric basis only, the illuminated/dark temperature variation ΔT would have to increase sharply below 90K by a factor as large as 30.

Further evidence in support of a nonbolometric response was obtained by measuring the photoresponse with the excitation beam focussed about 200 µm away from the microbridge. The scattered light which illuminated the microbridge in this configuration was considerably smaller than the light which illuminated the bridge when the beam was focussed directly on the microbridge, whereas the heating of the film was not changed significantly since the microbridge was within the thermal diffusion length of the area directly illuminated by the beam. The measured response was mainly bolometric and closely followed the resistance derivative.

Figure 3:
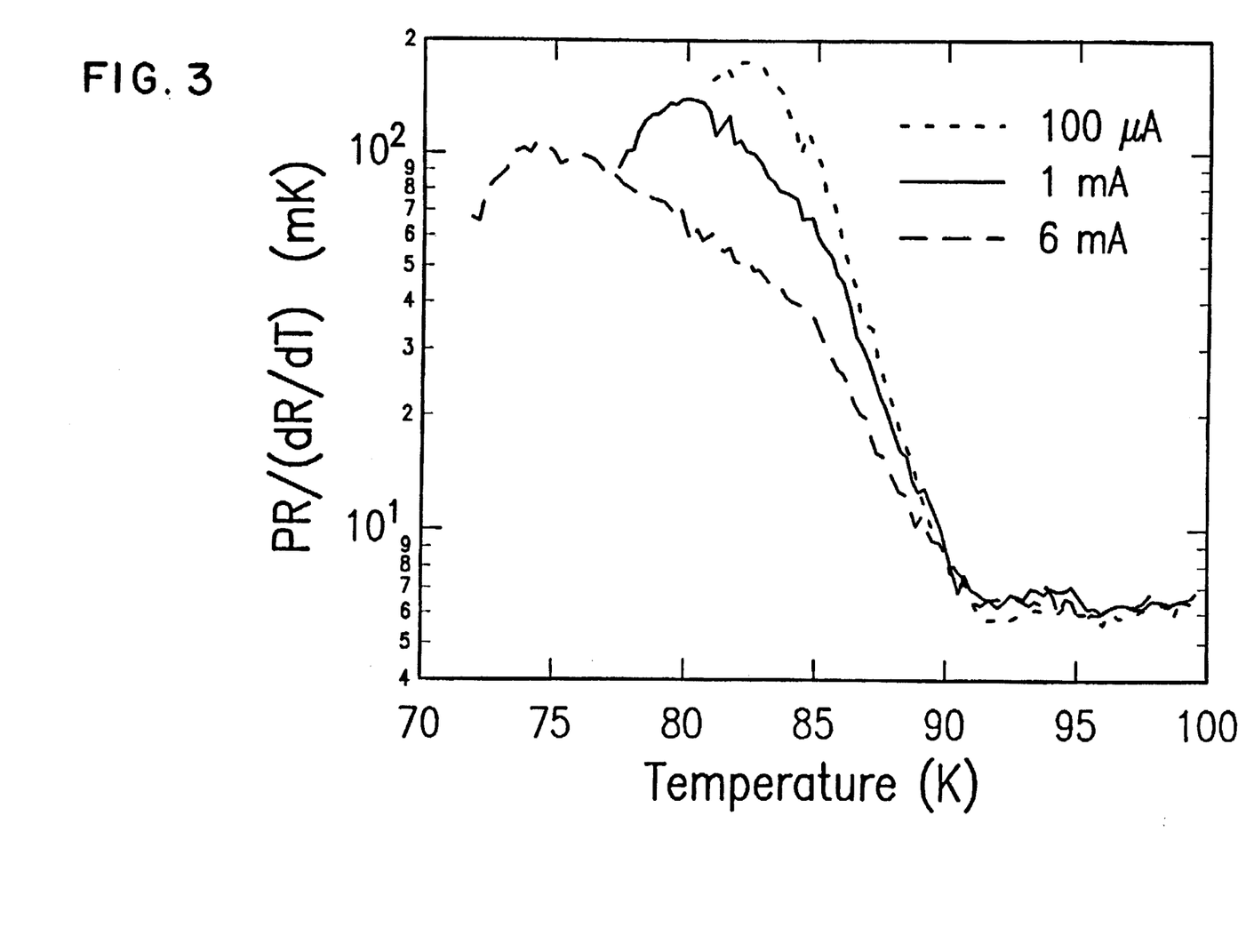
FIG. 3 is a graph of the photoresponse normalized by the temperature derivative of the resistance at various bias currents.

Finally, the results illustrated in FIG. 3 essentially rule out the possibility that the magnitude of the heating of the illuminated microbridge is changed significantly below the superconducting transition due to some variations in optical or thermal properties of the film or the film-substrate interface. FIG. 3 shows the measured photoresponse normalized by the resistance derivative at three different bias currents. The result of such normalization is an effective illuminated/dark temperature variation $\Delta T$, which would be the temperature increase of the film if the photoresponse were solely thermal in nature. FIG. 3 shows two features that cannot be explained by thermal arguments. First, the effective $\Delta T$ sharply increases below the superconductive transition onset by a factor of about 30, which is large to be fully accounted for by any changes in thermal properties of the film, substrate, or the interface. Second, the value of the effective illuminated/dark temperature variation $\Delta T$ depends strongly on the bias current. Since most of the film volume is superconducting even at currents above the critical current, the temperature variation of the film would be expected to be current independent if the response were determined only by the thermal properties of the system.

Similar results were obtained for $YBa_2Cu_3O_{7-\delta}$ films on a $SrTiO_3$ substrate. However, the distinction between the photoresponse and the bolometric signal was not as dramatic as that shown in FIG. 2. Two possible reasons for the difference between the two substrates are the following. The measured illuminated/dark temperature variation $\Delta T$ of the film on $SrTiO_3$ was substantially larger compared to that on $LaGaO_3$. This is probably due to the difference in the thermal properties of the two substrates. The thermal diffusivity of $SrTiO_3$ has been found to be smaller than that of $LaGO_3$ in the relevant temperature range. A larger temperature variation $\Delta T$ causes a larger bolometric signal, while the nonbolometric response would not be expected to change under the same illumination conditions. In addition, the sample on the $SrTiO_3$ substrate had a sharper superconductive transition, leading again to a larger bolometric contribution.

A possible mechanism for the observed nonbolometric response in the $YBa_2Cu_3O_{7-\delta}$ thin films is the following. The superconducting samples were of relatively high epitaxial quality as determined from the transition temperatures, critical currents, and X-ray diffraction measurements. Furthermore, their voltage/current behavior showed a monotonic increase the derivative of the voltage with respect to current in dV/dI, as the current increased, which indicates a non-granular behavior. Thus, the induced phase slip mechanism in the weak links as proposed in the article by Leung et al. cited above for granular films does not apparently apply to the present case. On the other hand, there is strong evidence that the critical currents in epitaxial films are limited by flux creep. Since a strong correlation is observed between the transport properties with and without illumination, it is suggested that the measured photoresponse is an evidence for photoenhanced flux creep in $YBa_2Cu_3O_{7-\delta}$ films. Under thermal equilibrium conditions and above the critical currents, a finite voltage drop is generally obtained due to thermally activated flux motion.

The activation process could be enhanced by photon absorption. Such an enhancement could, for example, occur via some vibrational modes which enhance the flux line excitations and thus induce excess flux creep.

It has been suggested that flux motion in high-$T_C$ single crystals is thermally activated, T. T. M. Palstra et al. *Phys. Rev. Lett.* vol. 61, pg. 1662, (1988); T. T. M. Palstra et al. *Appl. Phys. Lett.* vol. 54, (1989). Such thermally-activated flux motion implies the existence of finite resistance at all temperatures at fields larger than $H_{c1}$. In the present invention the photoresponse shows a sharp transition from bolometric—i.e., equilibrium—behavior to nonbolometric—i.e., nonequilibrium—behavior under essentially the same conditions where the resistivity shows a transition from current independent to current dependent regime. In the latter regime—characterized by a high current density—the resistivity of the $YBa_2Cu_3O_{7-\delta}$ epitaxial film shows a thermally activated behavior with a logarithmic scaling of the activation energy with current density.

The following experiments demonstrate the effect of a magnetic field on the photoresponse generated by a photoresponsive cell of the invention. High quality epitaxial films were deposited on (100) $SrTiO_3$ substrates using laser ablation with a Nd-YAG layer having a laser-beam wavelength of about 355 nm. An excimer laser-microscope system was used to pattern a film approximately 0.3 μm thick to form a microbridge about 22 μm wide and about 200 μm long. Photoresponse measurements were carried out with an approximately 1.5 mW HeNe laser beam having a wavelength of about 633 nm focused to a spot roughly 110 μm in diameter on the microbridge. The laser beam was mechanically chopped in the range of from about 40 Hz to about 18 kHz. A four-probe technique was used to measure simultaneously the resistivity and the photoresponse signal as a function of temperature at various bias currents and in the presence of magnetic fields. The magnetic fields were oriented essentially parallel to the c-axis of the epitaxial film and varied from about 5 to about 60 kOe.

The temperature dependance the photoresponse of $YBa_2Cu_3O_{7-\delta}$ film shows a sharp maximum in the superconductor transition region which is qualitatively similar the results in zero magnetic field discussed above in connection with FIGS. 1 through 3. Application of the magnetic field broadened the peak and shifted it to lower temperatures.

Figure 4:
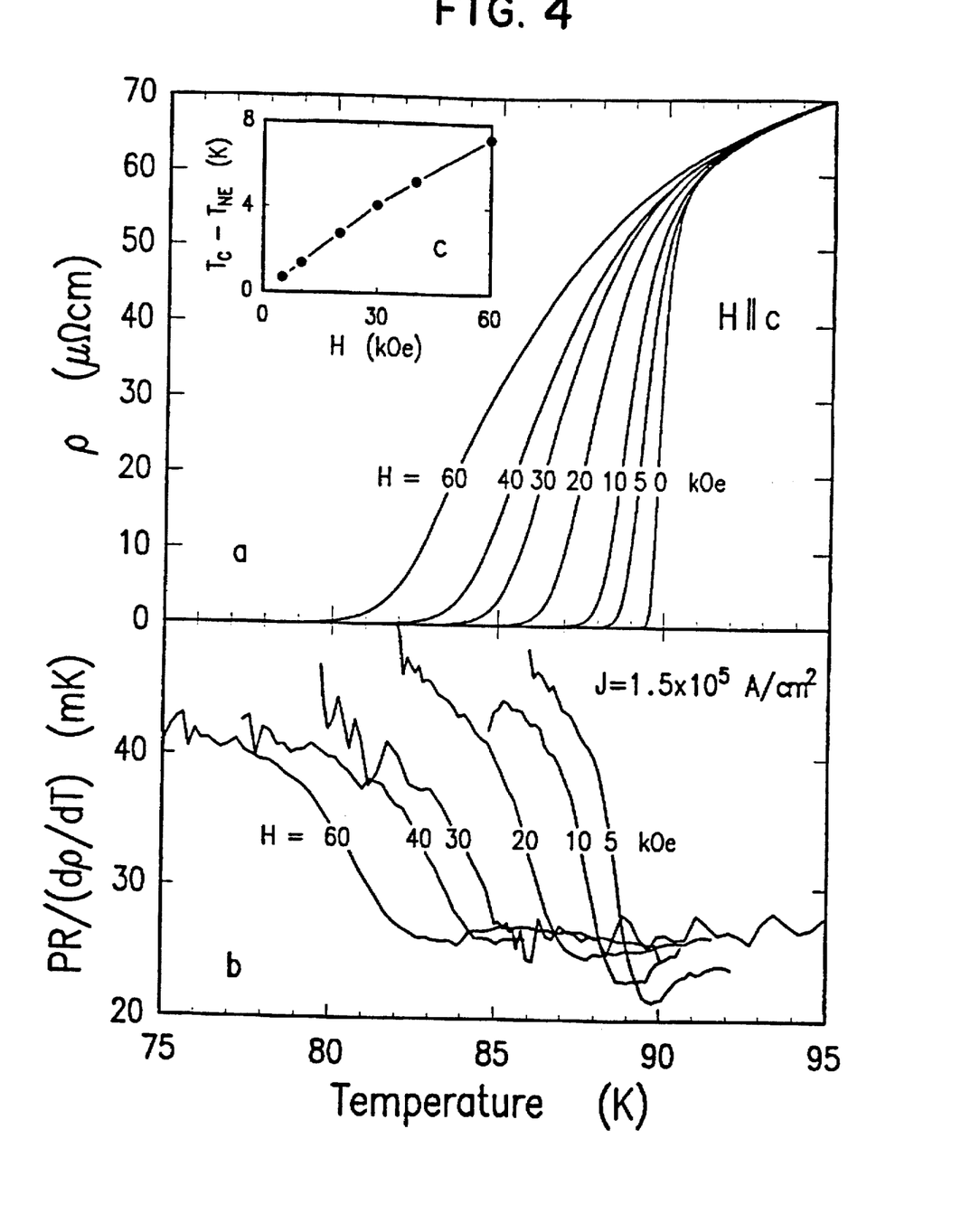
FIG. 4 is a graph of (a) the resistive transition and (b) the normalized photoresponse of $YBa_2Cu_3O_{7-\delta}$ epitaxial film at various magnetic fields. The insert is a graph of the nonbolometric onset temperature, $T_{NE}$, as a function of magnetic field H.

The measured photoresponse signal is the sum of a bolometric component and a nonbolometric component. For this sample the bolometric component appears to dominate essentially at all temperatures except at the lower edge of the superconductive transition. The bolometric component is essentially proportional to the temperature derivative of the resistivity, $d_{\rho 2}/dT$, which can be calculated numerically from $\rho(T)$ data such as that shown in FIG. 4a.

A sensitive method for distinguishing between the bolometric and nonbolometric components is to normalize the measured photoresponse by the temperature derivative of the resistivity $d_\rho/dT$ as measured under essentially identical experimental conditions to form a normalized photoresponse ratio. In the temperature range where the photoresponse is purely bolometric, this procedure will result in an essentially constant value for the normalized photoresponse ratio which is a measure of the illuminated/dark temperature variation $\Delta T$ of the sample due to optical heating. In the range where a nonbolometric component coexists with the bolometric component, the normalized photoresponse ratio will rise above the constant $\Delta T$ value, reflecting the relative amplitude of the nonbolometric component.

FIG. 4b shows the normalized photoresponse ratio as a function of temperature for various magnetic fields at a bias current of approximately 10 mA, which corresponds to a current density of about $1.5\times10^5$ A/cm$^2$. At temperatures above the superconductive transition temperature $T_C$, an essentially flat bolometric response is observed which is independent of the magnetic field and the bias current. (The "undershoot" at low magnetic fields is apparently due to self-heating effects at high resistivities and large $d_\rho/dT$). This essentially flat response extends through a large portion of the transition region. At low resistances a sharp onset of a nonbolometric response is observed. The magnetic field dependence of nonbolometric onset temperature, $T_{NE}$, is shown in the insert of FIG. 4a.

Figure 5:
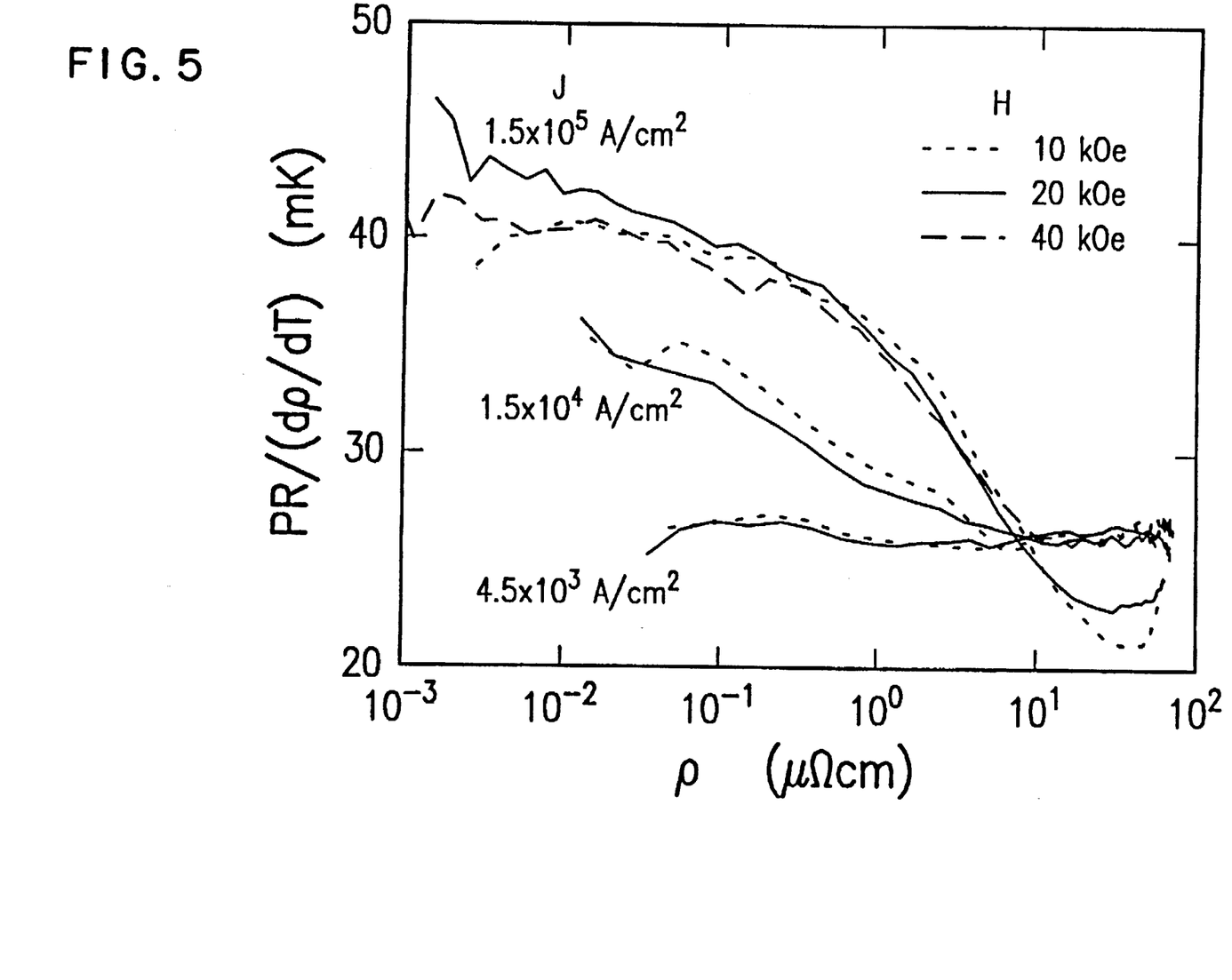
FIG. 5 is a graph of the normalized photoresponse as a function of resistivity at various magnetic fields and current densities.

In FIG. 5 the normalized photoresponse ratio of FIG. 4(b) is replotted as a function of ρ. The representation of FIG. 5 manifests the strong correlation between the nonbolometric photoresponse and the "dark" resistivity of the sample, indicating a common basic mechanism. The nonbolometric response sets in at a specific resistivity ρ of about 9 μΩ cm, which is roughly 15 percent of the normal resistivity $\rho_n$ and is essentially magnetic field independent. In addition, at a given bias current, the shape of the normalized photoresponse ratio as a function of resistivity is magnetic field independent as well. Finally, the photoresponse has a nonbolometric onset current density threshold of about $7\times10^3$ A/cm$^2$ below which the response essentially is purely bolometric in the entire measurable resistivity range.

Figure 6:
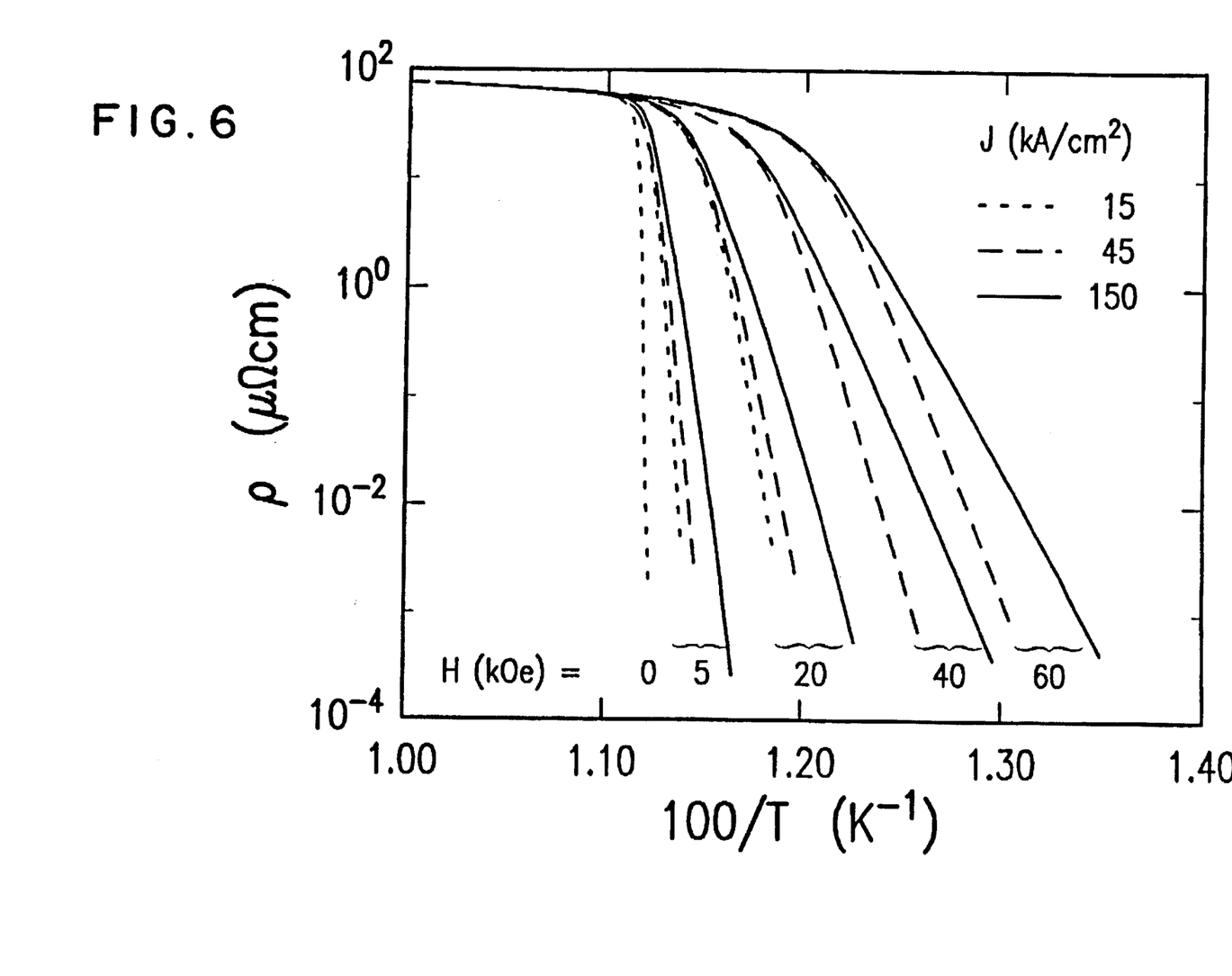
FIG. 6 is an Arrhenius plot of the resistivity at several representative values of magnetic field and current density.

Consider now the resistive transition results. In FIG. 6 the resistivity of the film is plotted against 1/T for representative values of the magnetic field H and the current density J. The data, which covers over five orders of magnitude, is divided into two regions. In a high resistivity-range that is, from about 0.2 $\rho_n$ to about $\rho_n$—the transition is broadened by the magnetic field, the resistivity is essentially current independent and the V-I characteristics are linear. In a low resistivity range, at low currents the behavior is essentially current independent and is described by an Arrhenius law. An Arrhenius-law behavior was reported in the publication by Palstra et al. cited above for YBa$_2$Cu$_3$O$_{7-\delta}$ and Bi$_{2.2}$Sr$_2$Ca$_{0.8}$Cu$_2$O$_{8+\delta}$ single crystals. At high current densities, the observed activation energy, U, is strongly current dependent. In this regime the V-I characteristics are superlinear with ρ(J) exhibiting a power law behavior. FIG. 6 shows some degree of "bending" in the low resistivity curves, implying a temperature dependence of the activation energy. The present data shows a good fit to a $(1-t)^{3/2}$ type of behavior, where t is a reduced temperature ratio defined by $t=T/T_C$, which functional form has been proposed by a number of researchers.

Figure 7:
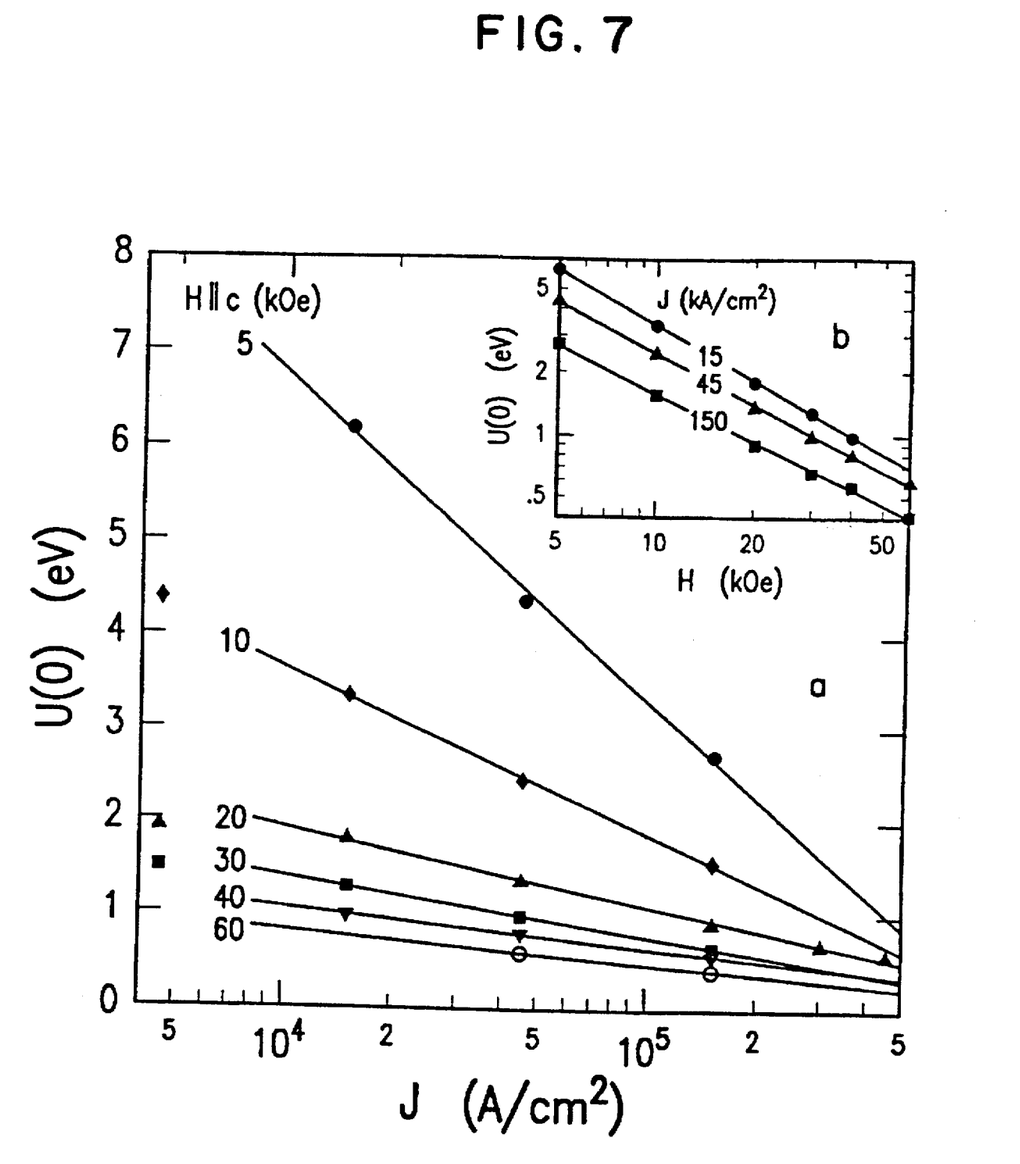
FIG. 7 is a plot of the activation energy, $U(O,H,J)$, as a function of current density J and magnetic field H as obtained from a fit of experimental data to the function $U(t,H,J)=U(O,H,J)(1-t^2)(1-t^4)^{1/2}$. The lines exhibit a logarithmic dependence of U on J, and a power law dependence on H. The slopes of the lines in the insert are approximately 0.88, 0.81, and 0.76 for current densities of about 15, 45, and 150 kA/cm$^2$, respectively.

In FIG. 7 the activation energy U(O,H,J) is presented as deduced from the low resistivity data by a fit to a temperature function g(t) proposed by Tinkham: $U(t,H,J)=U(O,H,J)g(t)=U(O,H,J)(1-t^2)(1-t^4)^{1/2}$. A feature of FIG. 7 is a log(J) dependence of the activation energy at current densities above about $7\times10^3$ A/cm$^2$. In this regime U(O,H,J) decreases with current and the magnetic field as $$U(O,H,J) \propto H^{-\beta}\log(J_0/J) \qquad (2)$$

The power law factor, β, of the magnetic field dependence is sensitive to the choice of the temperature function, g(t), since the magnetic field shifts the temperature range of the experiment significantly. Thus, for example, using the temperature function g(t) proposed by Tinkham, the insert of FIG. 7 gives a power law factor β of 0.88 at about 15 kA/cm$^2$. A similar fit to a $(1-t)^{3/2}$ function proposed by Yeshurun and Malozemoff results in β of approximately 0.95. These two values are very close to a predicted 1/H dependence and thus are self consistent with the choice of g(t). For comparison, a fit to the data with a temperature independent U results in a power-law factor β of about 0.55. The logarithmic current dependence of U exhibited in FIG. 7, however, is essentially independent of the choice of temperature function, g(t), since at a given magnetic field the shift of the temperature range with bias current is not significant. This logarithmic decrease was obtained with a number of different trial g(t) functions, including the case of temperature independent U, with extrapolated critical current density $J_0$ values in the range of from about $10^6$ to about $4\times10^6$ A/cm$^2$. The $J_0$ in Equation (2) is the "critical" current density at which U will drop to zero.

Additional evidence for the logarithmic current dependence of U, which excludes any possible temperature dependent effects, is the observation of the power law V-I characteristics at high currents. Using our empirical activation energy behavior, the resistivity obtains a unique form of:

$$\rho = \rho_0 \exp(-U/kT) = \rho_0 \left(\frac{J}{J_0}\right)^{A(0)H^{-\beta}/kT} \qquad (3)$$

where A is some proportionality constant. Thus, at a given temperature and magnetic field, Equation (3) indicates that the resistivity should be a power law function of J, as is indeed observed experimentally.

The nonbolometric photoresponse appears to occurs only in a relatively well-defined region, namely a resistivity ρ less than about 0.15 $\rho_n$ and a current density J greater than about $7\times10^3$ A/cm$^2$ for all the applied magnetic fields. This is the same region where ρ becomes strongly current dependent and the activation energy exhibits the behavior of Equation (2). It appears that these phenomena are flux creep related. A resistive transition "baseline" $\rho_B$(T,H) can be defined as the low current limit of ρ(T,H,J). For a given H, the resistivity follows this baseline for currents below some threshold value and shows a dramatic increase at higher currents. This baseline appears to be a "resistive transition" described by Tinkham and investigated experimentally by several groups. M. Tinkham, Phys. Rev. Lett. vol. 61, pg. 1858, (1988); T. T. M. Palstra et al. Phys. Rev. Lett. vol. 61, pg. 1662, (1988); J. D. Hettinger et al. Phys. Rev. Lett. vol. 62, pg. 2044, (1989). Tinkham states that the thermally activated flux line motion is highly damped and involves phase slippage analogous to the case of a heavily damped current-driven Josephson junction. V. Ambegaokar and B. I. Halperin, Phys. Rev. Lett. vol. 22, pg. 1364, (1969). Such an approach can be applied to the high resistivity data above to yield a qualitative fit to some degree. However, the shape of the curves is different. In addition, the broadening of the transition is close to the H$^{2/3}$ dependence predicted by Tinkham only in a high field regime. Below about 20 kOe, the broadening scales almost linearly with field in significant contrast to the predicted H$^{2/3}$ dependence, as can be seen in the insert of FIG. 4a.

For the high current regime, consider the basic equation for flux-creep induced resistivity:

$$\rho_f = \frac{2v_0BL}{J}\exp(-U_0/kT)\sinh(JBV_CL/kT), \qquad (4)$$

where $\rho_0$ is an attempt frequency and $U_0$ is a nominal activation energy for a flux line bundle of volume $V_C$ to hop a distance L. Equation (4) predicts a transition from a current-independent thermally-activated "baseline" resistivity at low driving forces to a current-dependent resistivity at high driving forces. Such a transition occurs when the argument of sinh is on the order of unity.

Using a nonbolometric onset our threshold current density of about $7\times 10^3$ A/cm$^2$ and a magnetic field of, e.g., 20 kG, an average value of about 538 Å for characteristic length scales of the volume and the hopping distance of a flux bundle is obtained. This is a physically reasonable value, especially if it is compared to the calculated flux line spacing, $a_0$, of 345 Å at the above field. Thus, the existence of the transition and the observed threshold current are at least consistent to a degree with Equation (4). However, the predicted behavior at high driving forces predicted by the Equation (4) is different from the experimental results. According to Equation (4), at high driving forces, the effective activation energy should decrease linearly with the current density J, whereas a strong logarithmic dependence was found above. Moreover, resistivity should increase approximately exponentially with the current, whereas experimentally the increase essentially follows a power law.

Although the mechanism of the nonbolometric behavior of the present invention is not fully understood at this time, the failure of Equation (4) to predict the observed behavior might be understood qualitatively as follows. At low driving forces such that the argument of sinh is small, the bias current does not alter either the mechanism or the rate of the flux bundle hopping, but rather induces a small imbalance between the two directions perpendicular to the current, which results in a non-zero net creep. Hence, the flux line bundles still hop randomly at the rate determined by the thermal equilibrium conditions, and their net drift due to the Lorentz force is small compared to their thermal motion. On the other hand, if the driving force is substantially increased, the flux creep, or the forced unidirectional hopping rate of the bundles, will be enhanced significantly and may become orders of magnitude larger than the random thermal equilibrium motion. Thus, in this regime a transition to a much different dynamics of a strongly correlated collective motion would be expected in which the involved pinning energies and the hopping volumes and distances may differ significantly from those at low driving forces. An additional possible source of a nonlinear U(J) is the current dependence of the pinning potential range $L_p$. As pointed out in a publication by Beasley et al., at high current densities, the pinning potential range $L_p$ may become current dependent due to the distortion of the potential well by the Lorentz force, thus resulting in a nonlinear driving force term in Equation (4). M. R. Beasley et al. *Phys. Rev.* vol.181, pg. 682, (1969).

The nonbolometric photoresponse of the present invention exists in a regime of high current densities where the apparent motion of the fluxons is significantly different from their motion at thermal equilibrium. The photoinduced increase of the resistivity arises from the enhancement of such flux motion due to optical excitation. Although the detailed mechanism responsible for such enhancement is not fully understood, the enhanced flux creep may be due to the presence of a nonequilibrium energy distribution of phonons rather than to a nonequilibrium density of quasi-particles which is very low at the optical illumination level used above. See J. Talvacchio, M. G. Forrester, and A. I. Braginski, in "Science and Technology of Thin-Film Superconductors" edited by R. McConnell and S. A. Wolf, (Plenum, New York, 1989) and references therein. The more energetic excess phonons perhaps enhance the thermal activation of the flux bundles in the presence of large driving forces, and thus increase the flux creep resistivity.

It is not intended to limit the present invention to the specific embodiments described above. It is recognized that changes may be made in the materials, structures and processes specifically described herein without departing from the scope and teaching of the instant invention, and it is intended to encompass all other embodiments, alternatives, and modifications consistent with the invention.

We claim:

1. A method of generating an electrical photoresponse to electromagnetic radiation comprising:
   (a) maintaining a photoresponsive element comprised of an essentially-single-crystalline nonbolometric-photoresponse-component-grade copper-oxide perovskite material at a temperature in a nonbolometric-photoresponse-component temperature range, the copper-oxide perovskite material having a superconductive transition at a superconductive-transition temperature, a normal threshold electrical resistivity of the copper-oxide perovskite material being denoted $\rho_n$ and defined by the normal electrical resistivity of the material at a superconductive-transition-threshold temperature close to and above the onset of the superconductive transition, the nonbolometric-photoresponse-component temperature range being defined by temperatures for which the electrical resistivity of the material is greater than zero and less than a nonbolometric-photoresponse-component limit resistivity;
   (b) inducing a bias current to flow through at least a portion of the copper-oxide perovskite material, the bias current having a current density greater than or equal to a nonbolometric-photoresponse-component limit current density; and
   (c) illuminating at least a portion of the copper-oxide perovskite material of the photoresponsive element through which the bias-current flows with electromagnetic radiation to generate an electrical photoresponse, the photoresponse having a significant nonbolometric photoresponse component relative to any bolometric photoresponse component.

2. The method of claim 1 in which the copper-oxide perovskite material is $YBa_2Cu_3O_{7-\delta}$.

3. The method of claim 2 in which the essentially-single-crystalline $YBa_2Cu_3O_{7-\delta}$ is an epitaxial film.

4. The method of claim 3 in which the nonbolometric-photoresponse-component limit resistivity is about 0.15 $\rho_n$ and the nonbolometric-photoresponse-component limit current density is about $7\times 10^3$ A/cm$^2$.

5. A photoresponsive cell for producing an electrical photoresponse upon illumination with electromagnetic radiation, the photoresponsive cell comprising:
   (a) a housing, the housing having an illumination port for admitting electromagnetic radiation into an interior of the housing;
   (b) a photoresponsive element mounted in the housing at a location such that electromagnetic radiation passing through the illumination port will illuminate at least a portion of the photoresponsive element, the photoresponsive element including:
      (b.1) a substantially-single-crystalline support substrate having an illumination-stage surface, the illumination-stage surface being positioned and oriented to be illuminated by electromagnetic radiation passing through the illumination port of the housing,
      (b.2) a substantially-single-crystalline nonbolometric-photoresponse-component-grade photoresponsive film of a copper-oxide perovskite material located on the illumination-stage surface of the support substrate in an epitaxially-oriented relationship, the copper-oxide perovskite material having a superconductive transition at a superconductive-transition temperature, a normal threshold electrical resistivity of the copper-oxide perovskite material being denoted $\rho_n$ and defined by the normal electrical resistivity of the material at a temperature close to and above the onset of the superconductive transition, and (b.3) bias-current electrodes electrically connected to the photoresponsive film at spaced-apart locations to define a bias-current flow path for a length of the film through which a bias current can flow, the photoresponsive film being dimensioned to have an effective cross-sectional area in a plane through which the bias current can flow;

(c) a temperature controller for maintaining the temperature of the photoresponsive film in operation at a temperature in a nonbolometric-photoresponse-component temperature range, the nonbolometric-photoresponse-component temperature range being defined by temperatures for which the electrical resistivity of the photoresponsive film is greater than zero and less than a nonbolometric-photoresponse-component limit resistivity; and (d) a bias-current-supply electrically connected to the bias-current electrodes and adapted to supply a nonbolometric-photoresponse-component bias current to the photoresponsive film, the nonbolometric-photoresponse-component bias current having a value such that the current density relative to the effective cross-sectional area of the photoresponsive film is equal to or greater a nonbolometric-photoresponse-component limit current density.

6. The photoresponsive cell of claim 5 in which the copper-oxide perovskite material is $YBa_2Cu_3O_{7-\delta}$.

7. The photoresponsive cell of claim 6 in which the essentially-single-crystalline support substrate is composed of $LaGaO_3$ or $SrTiO_3$.

8. The method of claim 7 in which the nonbolometric-photoresponse-component limit resistivity is about $0.15\,\rho_n$ and the nonbolometric-photoresponse-component limit current density is about $7 \times 10^3$ A/cm$^2$.

9. The method of claim 3 in which the epitaxial film of essentially-single-crystalline $YBa_2Cu_3O_{7-\delta}$ has a superconductive transition width at low current densities of about 2 degrees or less and a critical current density of about $10^6$ A/cm$^2$ or greater.

10. The photoresponsive cell of claim 6 in which the $YBa_2Cu_3O_{7-\delta}$ material of the photoresponsive film has a superconductive transition width at low current densities of about 4 degrees or less.

11. The photoresponsive cell of claim 10 in which the $YBa_2Cu_3O_{7-\delta}$ material of the photoresponsive film has a superconductive transition width at low current densities of about 2 degrees or less and a critical current density of about $10^6$ A/cm$^2$ or greater.

12. A method of generating an electrical photoresponse to electromagnetic radiation comprising:

(a) maintaining a photoresponsive element comprised of an essentially-single-crystalline nonbolometric-photoresponsive copper-oxide perovskite material which is characterized by sharpness of the superconductive transition at low current densities and by high critical current densities at a temperature in a nonbolometric-photoresponsive temperature range, the nonbolometric-photoresponsive temperature range being between temperatures for which the electrical resistivity of the material is greater than zero and less than a nonbolometric-photoresponsive limit resistivity at substantially the transition from current dependent to current independent regime;

(b) inducing a bias current to flow through at least a portion of the copper-oxide perovskite material, the bias current having a current density greater than or equal to a nonbolometric-photoresponsive limit current density; and (c) illuminating at least a portion of the copper-oxide perovskite material of the photoresponsive element through which the bias-current flows with electromagnetic radiation to generate an electrical photoresponse whereby the photoresponse has a significantly larger nonbolometric-photoresponse-component than any bolometric-photoresponse-component.

13. The method of claim 12 in which the essentially-single-crystalline perovskite material is an epitaxial $YBa_2Cu_3O_{7-\delta}$ film.

14. The method of claim 13 in which the $YBa_2Cu_3O_{7-\delta}$ film has a nonbolometric-photoresponsive limit resistivity of about 0.15 n where "n" is the normal resistivity of the material at a superconductive-transition threshold temperature close to and above the onset of the superconductive transition and a nonbolometric-photoresponsive limit current density of about $7 \times 10^3$ A/cm$^2$.

15. The method of claim 14 wherein the $YBa_2Cu_3O_{7-\delta}$ film has a superconductive transition width of 2 degrees or less and a critical current density of $10^6$ A/cm$^2$ or greater.

16. A photoresponsive cell for producing an electrical photoresponse upon illumination with electromagnetic radiation, the photoresponsive cell comprising:

(a) a housing, the housing having an illumination port for admitting electromagnetic radiation into an interior of the housing;

(b) a photoresponsive element mounted in the housing at a location such that electromagnetic radiation passing through the illumination port will illuminate at least a portion of the photoresponsive element, the photoresponsive element including:

(b.1) a substantially-single-crystalline support substrate having an illumination-stage surface, the illumination-stage surface being positioned and oriented to be illuminated by electromagnetic radiation passing through the illumination port of the housing, (b.2) a substantially-single-crystalline nonbolometric-photoresponsive film of a copper-oxide perovskite material located on the illumination-stage surface of the support substrate in an epitaxially-oriented relationship said photoresponsive film being characterized by the sharpness of the superconductive transition at low current densities and by high critical current densities in a nonbolometric-photoresponsive temperature range, and (b.3) bias-current electrodes electrically connected to the photoresponsive film at spaced-apart locations to define a bias-current flow path for a length of the film through which a bias current can flow, the photoresponsive film being dimensioned to have an effective cross-sectional area in a plane through which the bias-current can flow;

(c) a temperature controller for maintaining the temperature of the photoresponsive film in operation at a temperature in a nonbolometric-photoresponsive temperature range, the nonbolometric-photoresponsive temperature range being between temperatures for which the electrical resistivity of the photoresponsive film is greater than zero and less than a nonbolometric-photoresponsive limit resistivity where the bolometric-component of the photoresponse exceeds the nonbolometric-component photoresponse in magnitude; and (d) a bias-current supply means electrically connected to the bias-current electrodes and adapted to supply a nonbolometric-photoresponsive bias-current to the photoresponsive film, the nonbolometric-photoresponsive bias-current having a value such that the current density relative to the effective cross-sectional area of the photoresponsive film is equal to or greater a nonbolometric-photoresponsive limit current density so that the photoresponse has a significantly larger nonbolometric response component than any possible bolometric component.

17. The photoresponsive cell of claim 16 in which the copper-oxide perovskite material is $YBa_2, Cu_3O_{7-\delta}$.

18. The photoresponsive cell of claim 17 in which the essentially-single-crystalline support substrate is composed of $SrTiO_3$.

19. The photoresponsive cell of claim 18 in which the nonbolometric-photoresponsive limit resistivity is about 0.15 n where "n" is the normal resistivity of the material at a superconductive-transition threshold temperature close to and above the onset of the superconductive transition.

20. The photoresponsive cell of claim 18 in which the superconductive transition of the material occurs over 4 degrees or less.

21. The photoresponsive cell of claim 19 in which the superconductive transition of the material occurs over 2 degrees or less and the critical current density is $10^6/cm^2$ or greater.

* * * * *